US012796513B2

(12) United States Patent
Jung et al.

(10) Patent No.: US 12,796,513 B2
(45) Date of Patent: Nov. 10, 2026

(54) SEMICONDUCTOR PACKAGES AND METHODS OF MANUFACTURING THE SAME

(71) Applicant: Samsung Electronics Co., Ltd., Suwon-si (KR)

(72) Inventors: Kyoungok Jung, Suwon-si (KR); Jakyoung Gu, Suwon-si (KR); Seonghyun Yoo, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 268 days.

(21) Appl. No.: 18/419,694

(22) Filed: Jan. 23, 2024

(65) Prior Publication Data

US 2024/0379515 A1 Nov. 14, 2024

(30) Foreign Application Priority Data

May 12, 2023 (KR) ........................ 10-2023-0061663

(51) Int. Cl.
*H10W 70/685* (2026.01)
*H10W 20/20* (2026.01)
(Continued)

(52) U.S. Cl.
CPC ........ *H10W 70/685* (2026.01); *H10W 20/211* (2026.01); *H10W 70/686* (2026.01);
(Continued)

(58) Field of Classification Search
CPC . H10W 20/20; H10W 20/211; H10W 70/614; H10W 70/685; H10W 70/686;
(Continued)

(56) References Cited

U.S. PATENT DOCUMENTS

| | | | |
|---|---|---|---|
| 9,559,081 B1 | 1/2017 | Lai et al. | |
| 10,971,470 B2 | 4/2021 | Kim et al. | |

(Continued)

FOREIGN PATENT DOCUMENTS

| | | | |
|---|---|---|---|
| EP | 4216273 A1 * | 7/2023 | ............ H10W 90/00 |
| KR | 20220094867 A * | 7/2022 | ............ H10W 90/00 |

*Primary Examiner* — Matthew E Warren

(74) *Attorney, Agent, or Firm* — Wolf, Greenfield & Sacks, P.C.

(57) ABSTRACT

A semiconductor package, that includes: a first semiconductor chip including first pads; a second semiconductor chip including second pads on a first surface facing the first semiconductor chip and in contact with the first pads, and including through-electrodes electrically connected to the second pads and extending to a second surface, opposite to the first surface; a first dielectric layer that covers the rear surface of the second semiconductor chip and a portion of each of side surfaces of the through-electrodes thereof; a second dielectric layer that surrounds a side surface of the second semiconductor chip; and bump structures on a planar surface defined by the first dielectric layer and the second dielectric layer, and electrically connected to the through-electrodes, The first dielectric layer may include an inorganic compound, and the second dielectric layer may include an organic-inorganic composite material having a lower coefficient of thermal expansion than the inorganic compound.

15 Claims, 10 Drawing Sheets

10A

(51) Int. Cl.

| | |
|---|---|
| ***H10W 74/00*** | (2026.01) |
| ***H10W 74/10*** | (2026.01) |
| ***H10W 74/47*** | (2026.01) |
| ***H10W 90/00*** | (2026.01) |
| ***H10W 90/20*** | (2026.01) |

(52) U.S. Cl.
CPC ....... *H10W 74/121* (2026.01); *H10W 74/147* (2026.01); *H10W 74/47* (2026.01); *H10W 90/00* (2026.01); *H10W 90/701* (2026.01); *H10W 74/00* (2026.01); *H10W 90/297* (2026.01); *H10W 90/722* (2026.01); *H10W 90/724* (2026.01); *H10W 90/792* (2026.01); *H10W 90/794* (2026.01)

(58) Field of Classification Search
CPC . H10W 74/00; H10W 74/111; H10W 74/121; H10W 74/147; H10W 74/43; H10W 74/47; H10W 90/20; H10W 90/291; H10W 90/297; H10W 90/701; H10W 90/724; H10W 90/792; H10W 90/794
See application file for complete search history.

(56) References Cited

U.S. PATENT DOCUMENTS

| | | | | |
|---|---|---|---|---|
| 11,063,022 | B2 | 7/2021 | Chen et al. | |
| 11,145,623 | B2 * | 10/2021 | Hsu .................. | H10W 20/0249 |
| 2020/0118915 | A1 | 4/2020 | Yu et al. | |
| 2022/0028837 | A1 | 1/2022 | Hwang et al. | |
| 2022/0077117 | A1 | 3/2022 | Yu et al. | |
| 2022/0139807 | A1 | 5/2022 | Chen et al. | |
| 2023/0178533 | A1 * | 6/2023 | Jeon .................... | H10W 20/023<br>257/738 |
| 2023/0197679 | A1 * | 6/2023 | Ecton .................. | H10W 70/611<br>257/668 |
| 2024/0006272 | A1 * | 1/2024 | Kim ...................... | H10W 20/20 |
| 2024/0186248 | A1 * | 6/2024 | Haba ................... | H10W 20/427 |

* cited by examiner

10B

SEMICONDUCTOR PACKAGES AND METHODS OF MANUFACTURING THE SAME

CROSS-REFERENCE TO RELATED APPLICATION(S)

This application claims the benefit of priority to Korean Patent Application No. 10-2023-0061663, filed on May 12, 2023, in the Korean Intellectual Property Office, and the entire contents of the above-identified application are incorporated by reference herein.

TECHNICAL FIELD

The present disclosure relates to semiconductor packages and to methods of manufacturing the same.

BACKGROUND

Some semiconductor devices mounted in electronic devices are required to have high performance and high capacitance along with miniaturization. To realize this, semiconductor packages that include vertically stacked semiconductor chips interconnected using through-electrodes (e.g., through silicon vias) have been developed.

SUMMARY

Some aspects of the present disclosure provide semiconductor package having a simplified process and improved yield and a method of manufacturing the same.

According to some aspects of the present disclosure, a semiconductor package may include: a first semiconductor chip including first pads; a second semiconductor chip including second pads in contact with the first pads and on a first surface of the second semiconductor chip that faces the first semiconductor chip, the second semiconductor chip further including through-electrodes electrically connected to the second pads and extending to a second surface of the second semiconductor chip that is opposite from the first surface; a first dielectric layer that covers the second surface of the second semiconductor chip and a portion of each of side surfaces of the through-electrodes; a second dielectric layer that surrounds a side surface of the second semiconductor chip; and bump structures electrically connected to the through-electrodes and on a planar surface defined by the first dielectric layer and the second dielectric layer. The first dielectric layer may include an inorganic compound, and the second dielectric layer may include an organic-inorganic composite material having a lower coefficient of thermal expansion (CTE) than the inorganic compound.

According to some aspects of the present disclosure, a semiconductor package may include: a first semiconductor chip including first pads; a second semiconductor chip including second pads in contact with the first pads and on a first surface of the second semiconductor chip that faces the first semiconductor chip, the second semiconductor chip further including through-electrodes electrically connected to the second pads and extending to a second surface of the second semiconductor chip that is opposite from the first surface; semiconductor chips; a first dielectric layer that covers the second surface of the second semiconductor chip and a portion of each of side surfaces of the through-electrodes; a second dielectric layer that surrounds a side surface of the second semiconductor chip; and bump structures electrically connected to the through-electrodes and on the first dielectric layer and the second dielectric layer. The second dielectric layer may include an organic-inorganic composite material having cross-linked photosensitive functional groups.

According to some aspects of the present disclosure, a semiconductor package may include: a first semiconductor chip including first pads; a second semiconductor chip below the first semiconductor chip, and including second pads in contact with the first pads, and through-electrodes electrically connected to the second pads; a first dielectric layer surrounding portions of the through-electrodes that protrude from a second surface of the second semiconductor chip; a second dielectric layer that surround the second semiconductor chip below the first semiconductor chip; and bump structures on the first dielectric layer and the second dielectric layer, the bump structures electrically connected to the through-electrodes. The first dielectric layer and the second dielectric layer may include different materials, and a first planar surface defined by the first dielectric layer and the through-electrodes may be coplanar with a second planar surface defined by the second dielectric layer.

According to some aspects of the present disclosure, a method of manufacturing a semiconductor package may include: preparing a semiconductor wafer including first pads; attaching to the semiconductor wafer a preliminary semiconductor chip including second pads on a first surface and a plurality of preliminary through-electrodes buried in a preliminary substrate; etching the preliminary substrate to expose at least a portion of each of the plurality of preliminary through-electrodes to a second surface of the preliminary semiconductor chip; forming a first preliminary dielectric layer covering the rear surface of the preliminary semiconductor chip and the at least a portion of each of the plurality of preliminary through-electrodes exposed from the preliminary substrate; forming an organic-inorganic composite material layer on the first preliminary dielectric layer; forming a second preliminary dielectric layer by removing a portion of the organic-inorganic composite material layer; polishing the first preliminary dielectric layer, the second preliminary dielectric layer, and the plurality of preliminary through-electrodes, thereby forming a planar surface comprised of a first dielectric layer, a second dielectric layer, and a plurality of through-electrodes; and forming bump structures on the planar surface.

According to some aspects of the present disclosure, a method of manufacturing a semiconductor package may include: preparing a semiconductor wafer including first pads; attaching to the semiconductor wafer a preliminary semiconductor chip that includes second pads on a first surface and a plurality of preliminary through-electrodes buried in a preliminary substrate; etching the preliminary substrate to expose at least a portion of each of the plurality of preliminary through-electrodes to a second surface of the preliminary semiconductor chip; forming an organic-inorganic composite material layer covering the semiconductor wafer and the preliminary semiconductor chip; forming a second preliminary dielectric layer by removing a portion of the organic-inorganic composite material layer to expose the second surface of the preliminary semiconductor chip; forming a first preliminary dielectric layer covering the second surface of the preliminary semiconductor chip and the at least a portion of each of the plurality of preliminary through-electrodes exposed from the preliminary substrate; polishing the first preliminary dielectric layer, the second preliminary dielectric layer, and the plurality of preliminary through electrodes, thereby forming a planar surface comprised of a first dielectric layer, a second dielectric layer, and a plurality of through-electrodes; and forming bump structures on the planar surface.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, with reference to the accompanying drawings, preferred embodiments will be described as follows. Unless otherwise specified, in this specification, terms such as 'upper portion,' 'upper surface,' 'lower portion,' 'lower surface,' 'side surface,' and the like, are based on the drawings, and may actually vary depending on a direction in which the components are arranged.

Figure 1A:
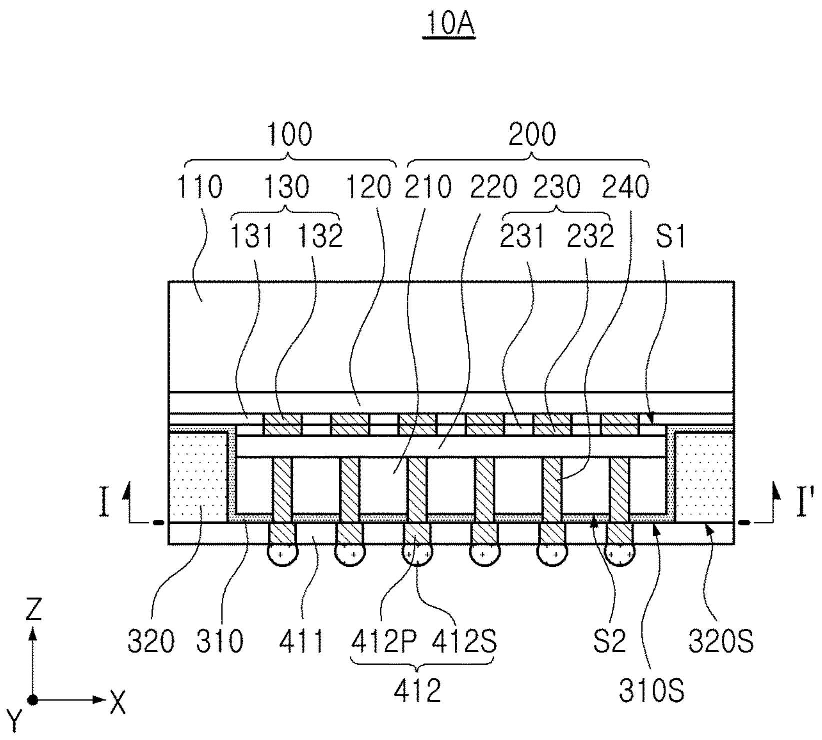
FIG. 1A is a cross-sectional view of a semiconductor package according to some embodiments.
Figure 1B:
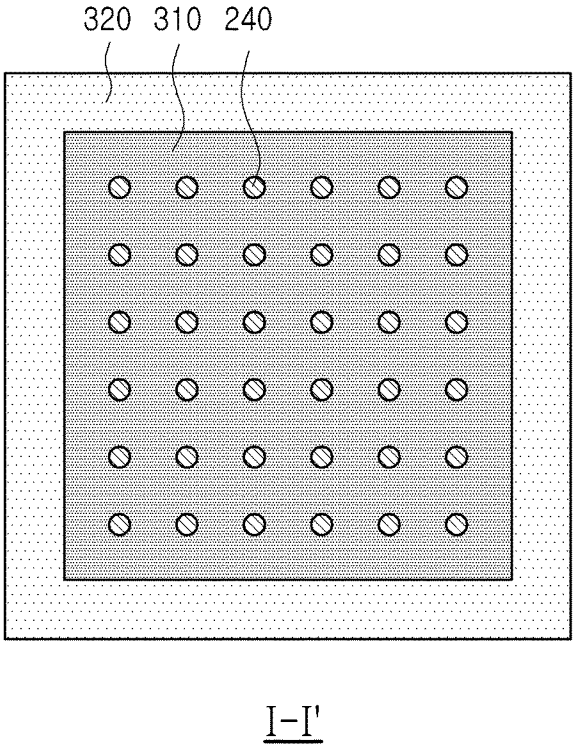
FIG. 1B is a plan view taken along line I-I' of FIG. 1A.

FIG. 1A is a cross-sectional view of a semiconductor package 10A according to some embodiments, and FIG. 1B is a plan view taken along line I-I' of FIG. 1A.

Referring to FIGS. 1A and 1B, a semiconductor package 10A according to some embodiments may include a first semiconductor chip 100, a second semiconductor chip 200, a first dielectric layer 310, and a second dielectric layer 320. According to some embodiments, the semiconductor package 10A may further include bump structures 412.

In the embodiment of FIGS. 1A and 1B, an active surface of the first semiconductor chip and an active surface of the second semiconductor chip 200 may be bonded to each other so that a signal transmission path between the first semiconductor chip 100 and the second semiconductor chip 200 may be minimized. In other words, a length of the signal transmission path between the first semiconductor chip 100 and the second semiconductor chip 200 may be minimized. Each of the first semiconductor chip 100 and the second semiconductor chip 200 may be or may include a logic chip including a central processor (CPU), a graphics processor (GPU), a field programmable gate array (FPGA), a digital signal processor (DSP), a cryptographic processor, a microprocessor, a microcontroller, an analog-digital converter, or the like, and/or a memory chip including a volatile memory (e.g., DRAM) and/or a non-volatile memory (e.g., ROM and flash memory). For example, the first semiconductor chip 100 may include a logic circuit such as an application specific integrated circuit (ASIC), and the second semiconductor chip 200 may include a cache memory circuit providing cache information to the first semiconductor chip 100. A size of the second semiconductor chip 200 may be smaller than that of the first semiconductor chip 100. For example, a width of the first semiconductor chip 100 in a first lateral or horizontal direction may be greater than a width of the second semiconductor chip 200 in the first lateral or horizontal direction.

In addition, the first semiconductor chip 100 and the second semiconductor chip 200 may be directly bonded and coupled without a separate connection member (e.g., a solder bump, a copper post, or the like). Such a structure may be referred to as hybrid bonding consisting of metal bonding by pads bonded to each other and dielectric bonding by insulating layers bonded to each other, direct bonding, or the like.

In addition, by filling both sides of the second semiconductor chip 200 with the second dielectric layer 320 including an organic-inorganic composite material, a difficulty of a planarization process may be reduced and a yield may be improved. In addition, by surrounding through-electrodes 240 with the first dielectric layer 310 formed of a different material from the second dielectric layer 320, the through-electrodes 240 may be protected and supported during the planarization process. The "planarization process" may include a chemical mechanical polishing (CMP) process, forming a first planar surface 310S defined by the through-electrodes 240 and the first dielectric layer 310 and a second planar surface 320S defined by the second dielectric layer 320. Accordingly, a lower surface of each of the through-electrodes 240, a lower surface of the first dielectric layer 310, and a lower surface of the lower surface of the second dielectric layer 320 may be substantially coplanar.

Hereinafter, each component of the semiconductor device 10A according to some embodiments will be described in greater detail.

The first semiconductor chip 100 may include a first substrate 110, a first circuit layer 120, a first insulating layer 131, and first pads 132. The first semiconductor chip 100 may have a flat lower surface provided by the first insulating layer 131 and the first pads 132. The first insulating layer 131 and the first pads 132 may be part of a first bonding layer 130.

The first substrate 110 may be a semiconductor wafer including a semiconductor element such as silicon or germanium, or a compound semiconductor such as silicon carbide (SIC), gallium arsenide (GaAs), indium arsenide (InAs), and indium phosphide (InP). The first substrate 110 may have an active surface (e.g., a surface facing the first circuit layer 120) having an active region doped with impurities and an inactive surface opposite thereto.

The first circuit layer 120 may be on the active surface of the first substrate 110. The first circuit layer 120 may include an integrated circuit comprised of individual elements (not shown) formed on the active surface of the first substrate 110 and an interconnection structure (not shown) electrically connecting the individual elements (not shown) to the first pads 132. The individual elements (not shown) may include FETs such as planar FETs, FinFETs, or the like, memory elements such as flash memories, DRAM, SRAM, EEPROM, PRAM, MRAM, FeRAM, RRAM, and the like, logic elements such as AND, OR, NOT, and the like, and various active elements and/or passive elements such as system LSI, CIS, and MEMS. The interconnection structure (not shown) may be formed as a multilayer structure including interconnection patterns and vias formed of, for example, aluminum (Al), gold (Au), cobalt (Co), copper (Cu), nickel (Ni), lead (Pb), tantalum (Ta), tellurium (Te), titanium (Ti), tungsten (W), or a combination thereof.

The first insulating layer 131 may be below the first circuit layer 120 and may surround the first pads 132. The first insulating layer 131 may include a material that can be bonded to the second insulating layer 231 of the second semiconductor chip 200, for example, at least one of, silicon oxide (SiO), silicon nitride (SiN), and silicon carbonitride (SiCN). That is, at least a portion of the first insulating layer 131 may be bonded to the second insulating layer 231, to form a bonding surface between the first semiconductor chip 100 and the second semiconductor chip 200.

The first pads 132 may be connection terminals electrically connected to the integrated circuit of the first circuit layer 120. The first pads 132 may be connected to the second pads 232 of the second semiconductor chip 200. The first pads 132 may include any one of copper (Cu), nickel (Ni), titanium (Ti), aluminum (Al), gold (Au), and silver (Ag), or alloys thereof. The first pads 132 may form a bonding surface between the first semiconductor chip 100 and the second semiconductor chip 200 together with the first insulating layer 131. A barrier layer including at least one of titanium (Ti), titanium nitride (TiN), tantalum (Ta), and tantalum nitride (TaN) may be formed between the first insulating layer 131 and the first pads 132.

The second semiconductor chip 200 may include a second substrate 210, a second circuit layer 220, a second insulating layer 231, second pads 232, and through-electrodes 240. The second semiconductor chip 200 may be provided with the second insulating layer 231 and the second pads 232, and may have a flat upper surface contacting the lower surface of the first semiconductor chip 100. The second semiconductor chip 200 may include a second bonding layer 230, which may include the second insulating layer 231 and the second pads 232. In some embodiments, the number of second semiconductor chips 200 may be smaller or larger than those shown in the drawings. For example, the second semiconductor chip 200 may include two or more semiconductor chips arranged below the first semiconductor chip 100 and directly adjacent to each other or spaced apart laterally from each other in a horizontal direction. In addition, according to some embodiments, the second semiconductor chip 200 may include a plurality of semiconductor chips stacked below the first semiconductor chip 100 in a vertical direction (Z-axis direction).

Since the second semiconductor chip 200 may have substantially the same or similar structure as the first semiconductor chip 100, the same or similar components are denoted by the same or similar reference numerals, and hereinafter, repeated descriptions of the same components are omitted. For example, since the second substrate 210 and the second circuit layer 220 may have the same or similar characteristics as the above-described first substrate 110 and the first circuit layer 120, and components corresponding to each other are indicated by similar reference numerals, with overlapping descriptions thereof omitted herein in the interest of brevity.

The second insulating layer 231 may be on the second circuit layer 220 and may surround the second pads 232. The second insulating layer 231 may include a material that can be bonded to the first insulating layer 131, for example, at least one of silicon oxide (SiO), silicon nitride (SiN), and silicon carbonitride (SiCN).

The second pads 232 may be connection terminals disposed on a front surface S1 of the second semiconductor chip 200 facing the first semiconductor chip 100. The second pads 232 may be electrically connected to an integrated circuit of the second circuit layer 220. The second pads 232 may form a bonding surface between the first semiconductor chip 100 and the second semiconductor chip 200 together with the second insulating layer 231. The second pads 232 may include any one of copper (Cu), nickel (Ni), titanium (Ti), aluminum (Al), gold (Au), and silver (Ag), or alloys thereof. For example, the second pads 232 may be bonded and coupled to the first pads 132.

The through-electrodes 240 may be electrically connected to the second pads 232 and extend to a rear surface S2 of the second semiconductor chip 200, opposite to the front surface S1. The through-electrodes 240 may penetrate or extend through the second substrate 210 and may protrude to or through the rear surface S2 of the second substrate 210. In other words, a vertical length of each of the through-electrodes 240 may be greater than a thickness in the vertical direction of the second substrate 210. Each of the through-electrodes 240 may be electrically connected to bump structures 412. The through-electrodes 240 may include a via plug and a side barrier film (not shown) surrounding a side surface of the via plug. The via plug may include, for example, tungsten (W), titanium (Ti), aluminum (Al), or copper (Cu), and may be formed through a plating process, a PVD process, or a CVD process. The side barrier film may include titanium (Ti), titanium nitride (TiN), tantalum (Ta), or tantalum nitride (TaN), and may be formed through a plating process, a PVD process, or a CVD process. A side insulating film (not shown) including an insulating material (e.g., high aspect ratio process (HARP) oxide) such as silicon oxide, silicon nitride, silicon oxynitride, or the like, may be formed between the through-electrodes 240 and the second substrate 210.

The first dielectric layer 310 may be formed to cover the rear surface S2 of the second semiconductor chip 200 and a portion of each of side surfaces of the through-electrodes 240 thereof. In some embodiments, the first dielectric layer 310 may extend to a side surface of the second semiconductor chip 200 and a lower surface of the first semiconductor chip 100. In this case, the second dielectric layer 320 may be spaced apart from the side surface of the second semiconductor chip 200 and the lower surface of the first semiconductor chip 100.

The second dielectric layer 320 may be formed below the first semiconductor chip 100 and may surround a side surface of the second semiconductor chip 200. The second dielectric layer 320 may define a second planar surface 320S. The second planar surface 320S may be coplanar with the first planar surface 310S defined by the first dielectric layer 310 and the through-electrodes 240.

The first dielectric layer 310 and the second dielectric layer 320 may include different materials. The first dielectric layer 310 may include an inorganic compound applied to protect the through-electrodes 240 in a planarization process (e.g., a CMP process). For example, the inorganic compound may include at least one of silicon oxide (SiO) and silicon nitride (SiN).

The second dielectric layer 320 may include an organic-inorganic composite material having a relatively low coefficient of thermal expansion (CTE) compared to the first dielectric layer 310, which may control warpage. The coefficient of thermal expansion (CTE) of the 'organic-inorganic composite material' may be in a range of about 60 ppm/° C. or less, for example, about 1 ppm/° C. to about 60 ppm/° C., about 1 ppm/° C. to about 30 ppm/° C., about 1 ppm/° C. to about 10 ppm/° C., or the like, but the present disclosure is not limited thereto.

The second dielectric layer 320 may include an organic-inorganic composite material applied to reduce a time of a planarization process (e.g., a CMP process). In some embodiments, a photolithography process may be performed to remove a portion of the organic-inorganic composite material covering directly above the second semiconductor chip 200, and a second dielectric layer 320 surrounding the second semiconductor chip 200 may be formed (see FIGS. 2D to 2F). Accordingly, an application time of a polishing process may be shortened and a process difficulty may be reduced, as compared to when the second semiconductor chip 200 is exposed by applying the polishing process (e.g., CMP process) to a dielectric material (e.g., silicon oxide) that covers the semiconductor chip 200. That is, the second dielectric layer 320 may include an organic-inorganic composite material having photosensitive functional groups crosslinked by exposure. The 'organic-inorganic composite material' may include at least one of a silane-based compound and a siloxane-based compound having a photosensitive functional group.

The silane-based compound having the photosensitive functional group may include, for example, (meth)acrylamidopropylalkoxysilane-based, (meth)acryloxymethylalkoxysilane-based, (meth)acryloxyphenylalkoxysilane-based, or oligomers or polymers thereof, but the present disclosure is not limited thereto. For example, the 'organic-inorganic composite material' may include a silane-based compound having a structure of [Formula 1] below. In [Formula 1], 'R' may include a photosensitive functional group such as epoxy, acrylate, or methacrylate. For example, the 'organic-inorganic composite material' may be a silylated epoxy in which epoxy is bonded to [Formula 1]. However, the photosensitive functional group is not limited to the above-mentioned materials.

[Formula 1]

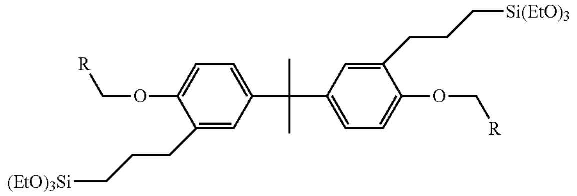

The siloxane-based compound having the photosensitive functional group may include, for example, (meth)acrylic-POSS, styryl-POSS, and the like. The siloxane-based compound may be, for example, polysilsesquioxane having a structure of the following [Formula 2-1], [Formula 2-2], [Formula 2-3], [Formula 2-4], [Formula 2-5], and [Formula 2-6]. [Formula 2-1] represents a partial cage structure, [Formula 2-2] represents a ladder structure, [Formula 2-3] represents a Random structure, [Formula 2-4] represents a T8 cage structure, [Formula 2-5] represents a T10 cage structure, and [Formula 2-6] represents a T12 cage structure. In [Formula 2-1], [Formula 2-2], [Formula 2-3], [Formula 2-4], [Formula 2-5], and [Formula 2-6], 'R' may include photosensitive functional groups such as epoxy, acrylate, and methacrylate, but the present disclosure is not limited thereto. For example, the photosensitive functional group may include styryl, or the like, in addition to the above-described materials.

[Formula 2-1]

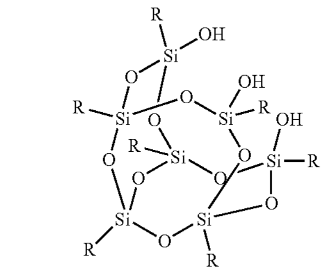

[Formula 2-2]

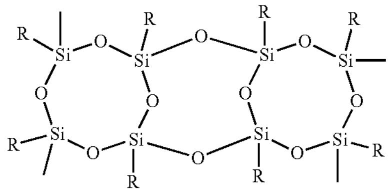

[Formula 2-3]

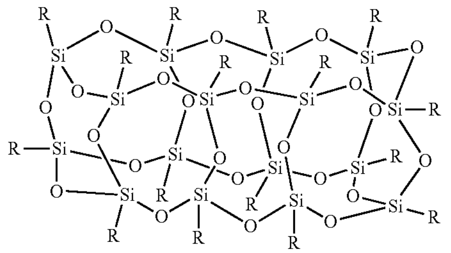

[Formula 2-4]

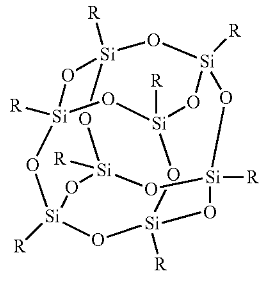

[Formula 2-5]

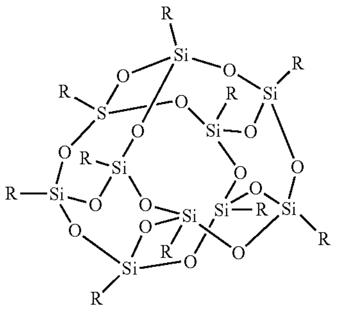

-continued

[Formula 2-6]

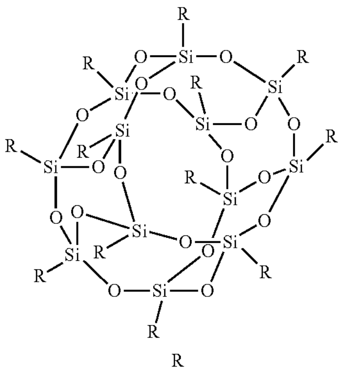

The bump structures 412 may be on the first dielectric layer 310 and the second dielectric layer 320, and may be electrically connected to the through-electrodes 240. The bump structures 412 may be on the planar surfaces 310S and 320S defined by the first dielectric layer 310 and the second dielectric layer 320. The semiconductor package 10A may be connected through the bump structures 412 to one or more external devices, such as a module substrate, a main board, or the like. For example, the bump structures 412 may include a pillar portion 412P and a solder portion 412S. The pillar portion 412P may include copper (Cu) or an alloy of copper (Cu), and the solder portion 412S may include a low melting point metal, for example, tin (Sn) or an alloy (Sn—Ag—Cu) including tin (Sn). According to some embodiments, the bump structures 412 may include only the pillar portion 412P or only the solder portion 412S.

A protective layer 411 surrounding the bump structures 412 may be formed below the second dielectric layer 320. The protective layer 411 may protect the bump structures 412 from external physical/chemical damage. The protective layer 411 may be formed using prepreg, Ajinomoto Build-up Film (ABF), FR-4, Bismaleimide Triazine (BT), photo-imageable dielectric (PID), photo solder resist, or the like. According to some embodiments, the protective layer 411 may be formed to cover a lower surface of the pillar portion 412P or may be omitted.

FIGS. 2A to 2G are cross-sectional view illustrating a method of manufacturing the semiconductor package 10A shown in FIGS. 1A and 1B according to a process sequence.

Figure 2A:
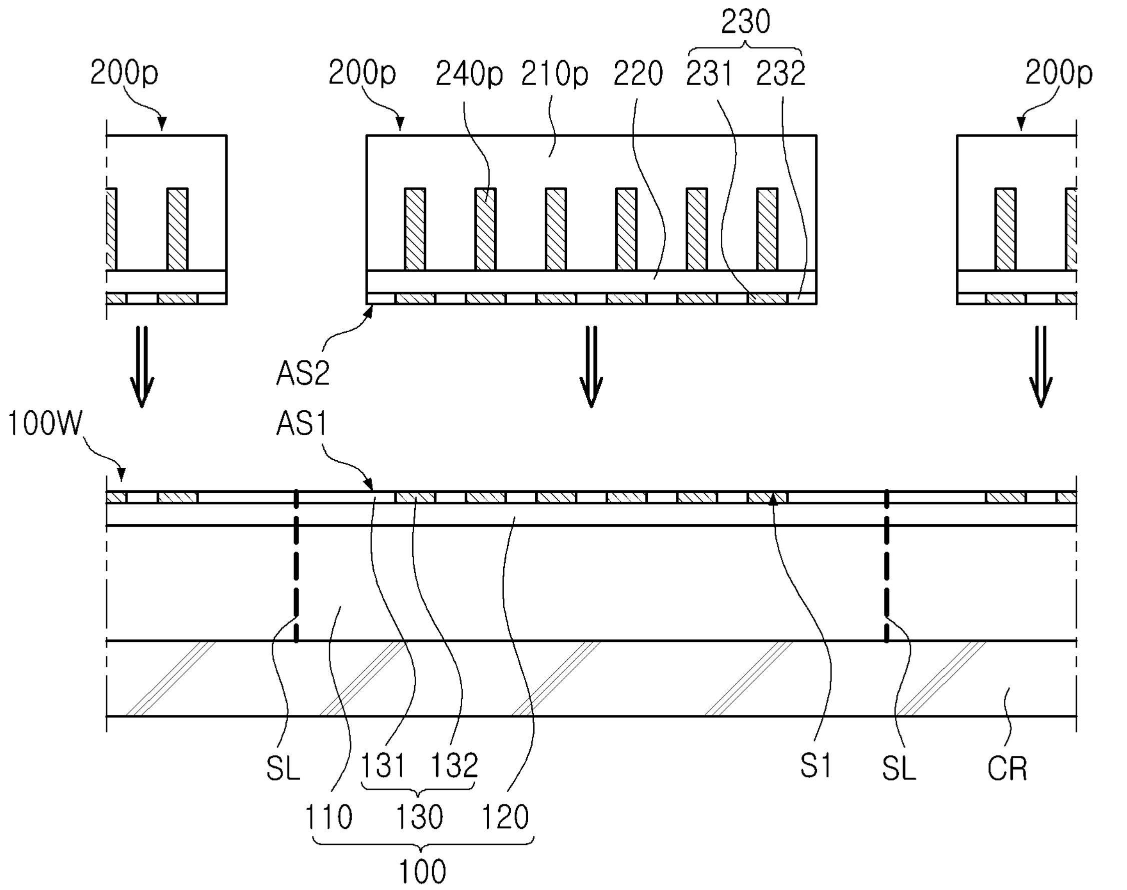
FIGS. 2A to 2G are cross-sectional views illustrating a method of manufacturing the semiconductor package shown in FIG. 1A according to a process sequence.

Referring to FIG. 2A, a semiconductor wafer 100W for a first semiconductor chip 100 may be prepared. The semiconductor wafer 100W may include a plurality of first semiconductor chips 100 separated by scribe lines SL. The semiconductor wafer 100W may be in a state in which a first circuit layer 120 and a first bonding layer 130 for the first semiconductor chip 100 are formed on a first substrate 110. The first bonding layer 130 may include a first insulating layer 131 and first pads 132. The semiconductor wafer 100W may be on a carrier CR and arranged so that a first active surface AS1 on which the first pads 132 are provided faces upwardly.

Next, a preliminary semiconductor chip 200*p* may be attached to the semiconductor wafer 100W. The preliminary semiconductor chip 200*p* may include a preliminary substrate 210*p* before a thickness thereof is adjusted through a back grinding process, a second circuit layer 220 and a second bonding layer 230 on a front surface of the preliminary substrate 210*p*, and a plurality of preliminary through-electrodes 240*p* buried in the preliminary substrate 210*p*. The preliminary semiconductor chip 200*p* may be on the semiconductor wafer 100W so that a second active surface AS2 on which the second pads 232 are provided faces downwardly. The preliminary semiconductor chip 200*p* may be arranged so that the second active surface AS2 contacts the first active surface AS1.

Thereafter, a thermal compression process may be performed to couple the first semiconductor chip 100 and the preliminary semiconductor chip 200*p*. The thermal compression process may be performed in a thermal atmosphere in a range from about 100° C. to about 300° C. However, the temperature in the thermal atmosphere is not limited to the above-described range and may be variously changed.

Figure 2B:
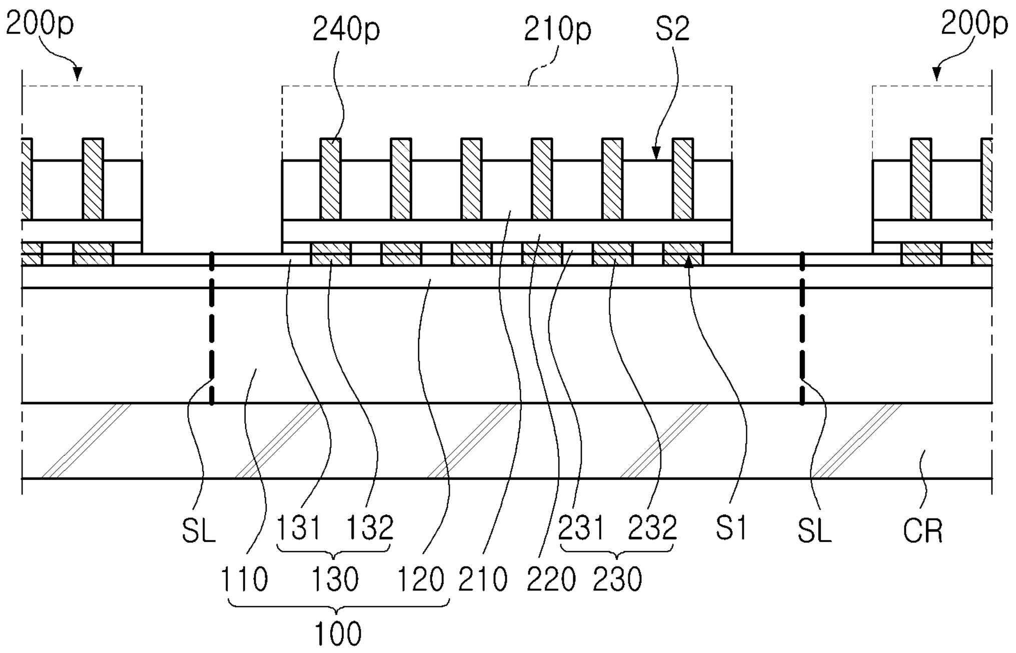

Referring to FIG. 2B, the preliminary substrate 210*p* may be etched to expose at least a portion of each of the plurality of preliminary through-electrodes 240*p* to or through a rear surface S2 of the preliminary semiconductor chip 200*p*. A substrate 210 having a desired thickness may be formed by applying a back grinding process and an etch-back process to the preliminary substrate 210*p*. For example, the preliminary substrate 210*p* may be reduced to a certain thickness by performing a back grinding process, and the plurality of preliminary through electrodes 240*p* may be sufficiently exposed by applying an etch-back under appropriate conditions.

Figure 2C:
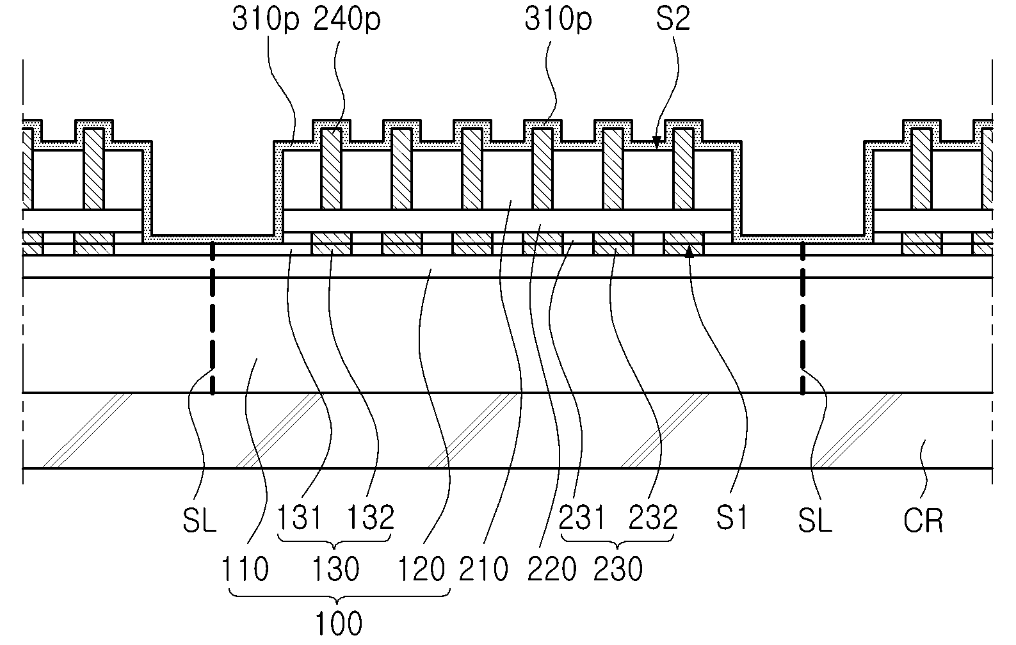

Referring to FIG. 2C, a first preliminary dielectric layer 310*p* may be forms that covers the rear surface S2 of the preliminary semiconductor chip 200*p* and the at least a portion of each of the plurality of preliminary through-electrodes 240 exposed from the preliminary substrate 210*p*. The first preliminary dielectric layer 310*p* may include at least one of silicon oxide (SiO) and silicon nitride (SiN). The first preliminary dielectric layer 310*p* may be formed using a PVD or CVD process.

Figure 2D:
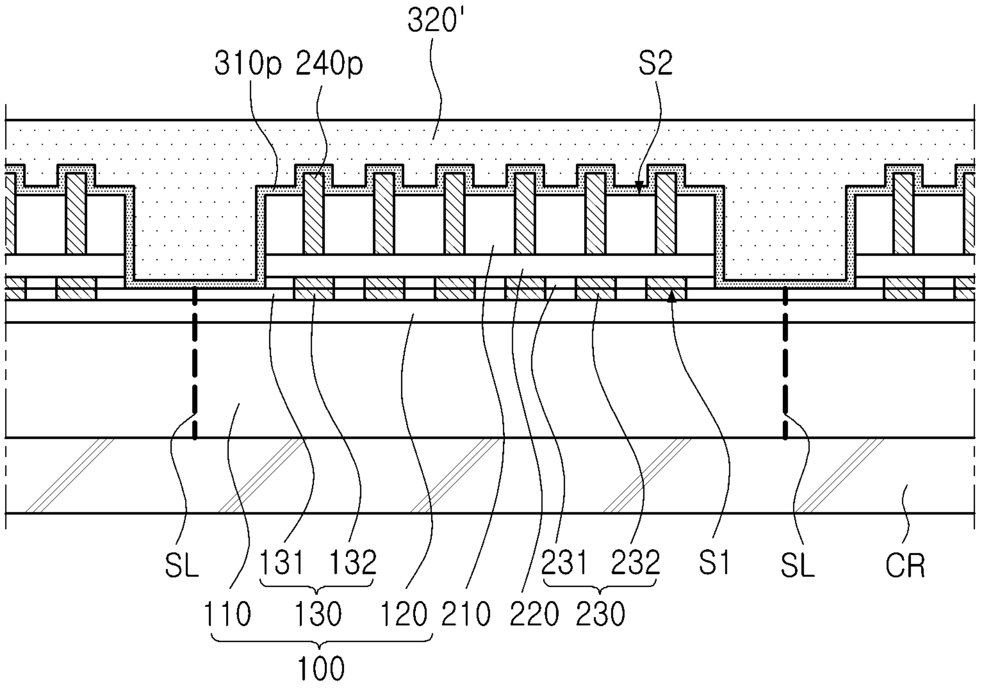

Referring to FIG. 2D, an organic-inorganic composite material layer 320' may be formed on the first preliminary dielectric layer 310*p*. The organic-inorganic composite material layer 320' may include at least one of a silane-based compound and a siloxane-based compound having photosensitive functional groups. For example, the organic-inorganic composite material layer 320' may include a photosensitive organic-inorganic composite material in which an epoxy group, an acrylate group, or a methacrylate group is bonded to at least one compound of the above-described [Formula 1], [Formula 2-1], [Formula 2-2], [Formula 2-3], [Formula 2-4], [Formula 2-5] and [Formula 2-6]. The photosensitive organic-inorganic composite material may be prepared by, for example, a sol-gel process, but the present disclosure is not limited thereto. The organic-inorganic composite material layer 320' may further include a photoinitiator (e.g., PAG, photoinitiator) as a material that initiates a crosslinking and/or curing reaction between photosensitive functional groups. In addition, the organic-inorganic composite material layer 320' may further include a filler (e.g., silica) for adjusting a coefficient of thermal expansion.

Figure 2E:
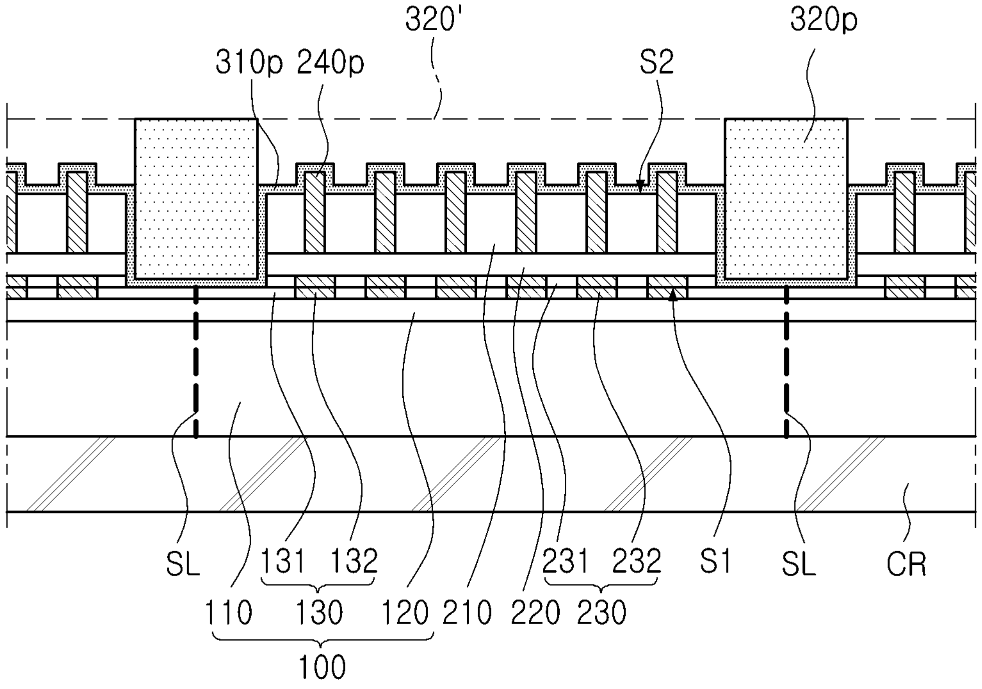

Referring to FIG. 2E, a second preliminary dielectric layer 320*p* may be formed by removing a portion of the organic-inorganic composite material layer 320'. A portion of the organic-inorganic composite material layer 320' that covers the rear surface S2 of the preliminary semiconductor chip 200*p* may be removed by an exposure process and a development process. For example, the exposed portion of the organic-inorganic composite material layer 320' may be cross-linked and/or cured, and the unexposed portion (non-exposed portion) may be removed by a developer such as tetramethylammonium hydroxide (TMAH), an organic solvent, or the like. As a result thereof, the second preliminary dielectric layer 320*p* may include at least one of a silane-based compound and a siloxane-based compound having cross-linked photosensitive functional groups.

Figure 2F:
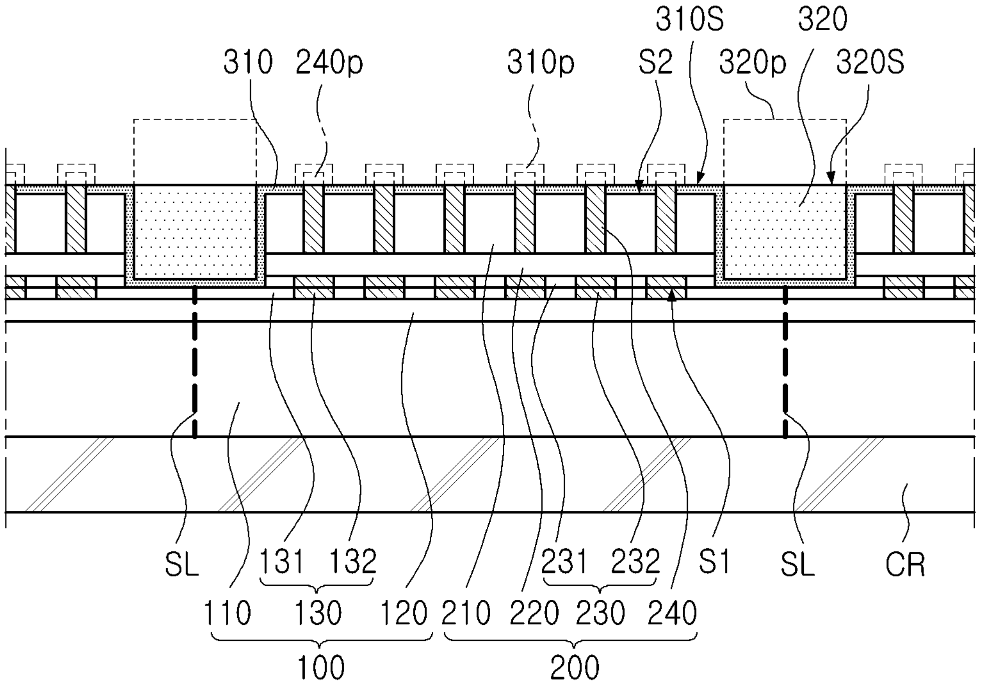

Referring to FIG. 2F, by applying a polishing process to the first preliminary dielectric layer 310*p*, the second preliminary dielectric layer 320*p*, and the plurality of preliminary through-electrodes 240*p*, a planar surface comprised of the first dielectric layer 310 and the second dielectric layer 320, and a plurality of through-electrodes 240 may be formed. The polishing process may include a chemical mechanical polishing (CMP) process. The first dielectric layer 310 that defines a first planar surface 310S and the second semiconductor chip 200 (or the second dielectric layer 320) that defines a second planar surface 320S may be formed by the polishing process. The first planar surface 310S and the second planar surface 320S may be substantially coplanar. At the time of application of the polishing process, since a portion of the organic-inorganic composite material layer 320' covering the rear surface S2 of the second semiconductor chip 200 has already been removed, a polishing process time may be shortened and a process difficulty may be reduced.

Figure 2G:
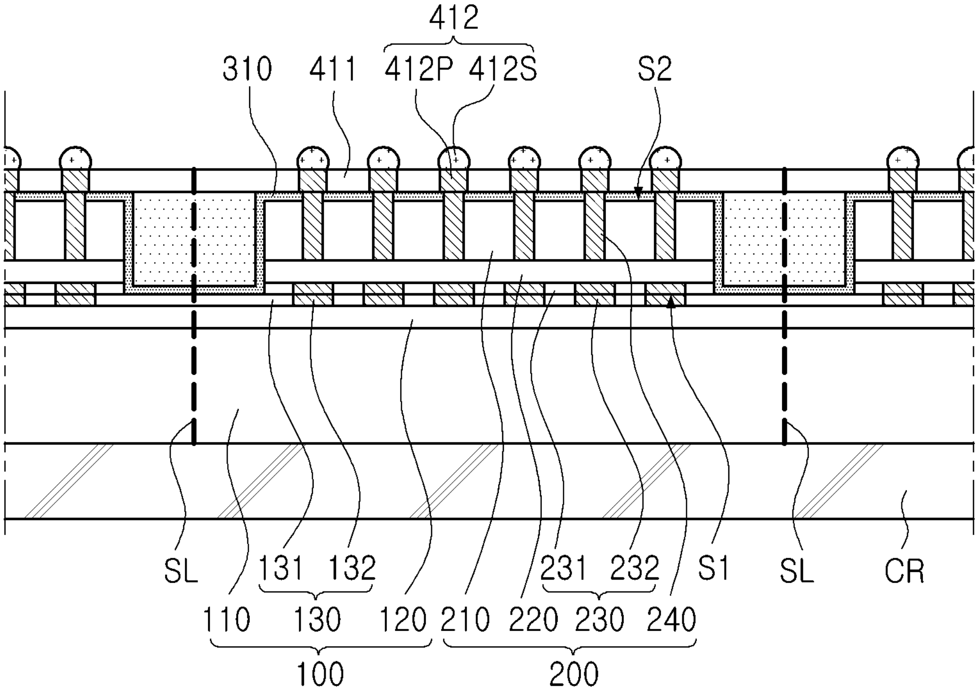

Referring to FIG. 2G, a protective layer 411 and bump structures 412 may be sequentially formed on a planar surface formed through a polishing process. The protective layer 411 may be formed using, for example, a photosensitive resin such as PID or PSR. The bump structures 412 may include a pillar portion 412P and a solder portion 412S. Thereafter, a cutting process may be performed along the scribe line SL to separate the semiconductor packages.

Figure 3:
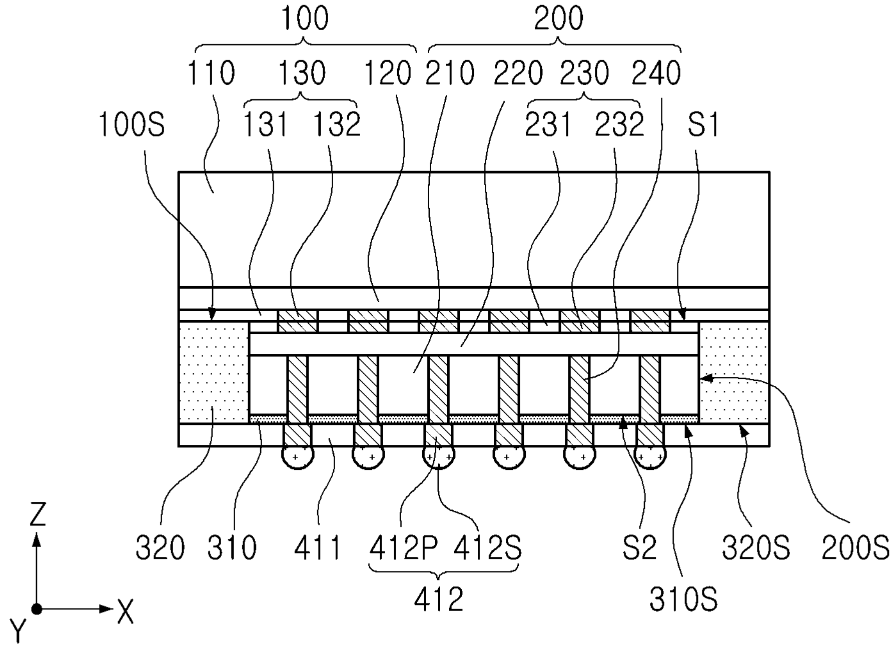
FIG. 3 is a cross-sectional view illustrating a semiconductor package according to some embodiments.

FIG. 3 is a cross-sectional view illustrating a semiconductor package 10B according to some embodiments.

Referring to FIG. 3, a semiconductor package 10B according to some embodiments may have the same or similar features as those described with reference to FIGS. 1A and 1B, except that a second dielectric layer 320 may be in contact with a lower surface of the first semiconductor chip 100 and a side surface of the second semiconductor chip 200. In some embodiments, the first dielectric layer 310 may be only on a rear surface S2 of the second semiconductor chip 200. The second dielectric layer 320 may directly contact a side surface of the first dielectric layer 310, a side surface of the second semiconductor chip 200, and a lower surface of the first semiconductor chip 100. Even in this case, the first planar surface 310S defined by the first dielectric layer 310 and the second planar surface 320S defined by the second dielectric layer 320 may be substantially coplanar. The semiconductor package 10B according to some embodiments may be manufactured by a manufacturing method described below with reference to FIGS. 4A to 4D.

FIGS. 4A to 4D are cross-sectional views illustrating a method of manufacturing the semiconductor package 10B shown in FIG. 3 according to a process sequence.

Figure 4A:
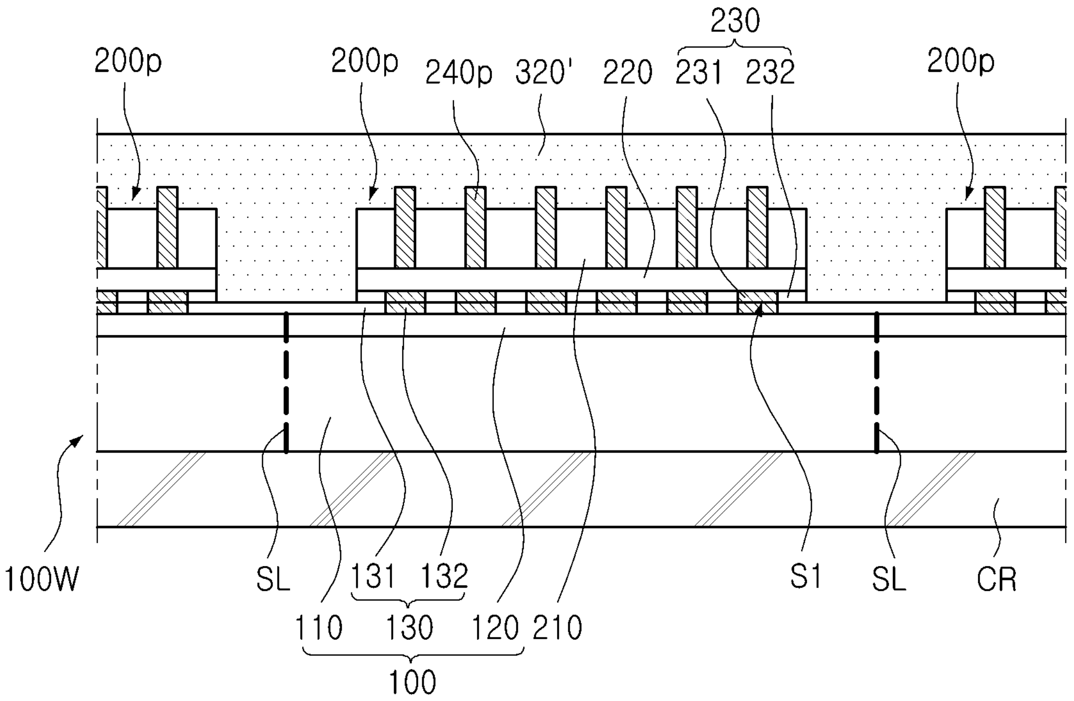
FIGS. 4A to 4D are cross-sectional views illustrating a method of manufacturing the semiconductor package shown in FIG. 3 according to a process sequence.

Referring to FIG. 4A, an organic-inorganic composite material layer 320' covering the semiconductor wafer 100W and the preliminary semiconductor chip 200*p* may be formed. The semiconductor wafer 100W and the preliminary semiconductor chip 200*p* may be bonded and coupled in a method similar to that described with reference to FIG. 2A. A plurality of preliminary through-electrodes 240*p* may be exposed in a similar manner to that described with reference to FIG. 2B. However, according to some embodiments, the plurality of preliminary through-electrodes 240*p* may be exposed immediately before forming a first preliminary dielectric layer 310*p* described below. For example, the preliminary substrate 210*p* shown in FIG. 4A may be in a state in which a back grinding process is applied to cover the plurality of preliminary through-electrodes 240*p*. Thereafter, an etch-back process may be applied to the preliminary substrate 210P that is exposed by removing a portion of the organic-inorganic composite material layer 320' by performing a photolithography process to expose the plurality of preliminary through-electrodes 240*p*.

Figure 4B:
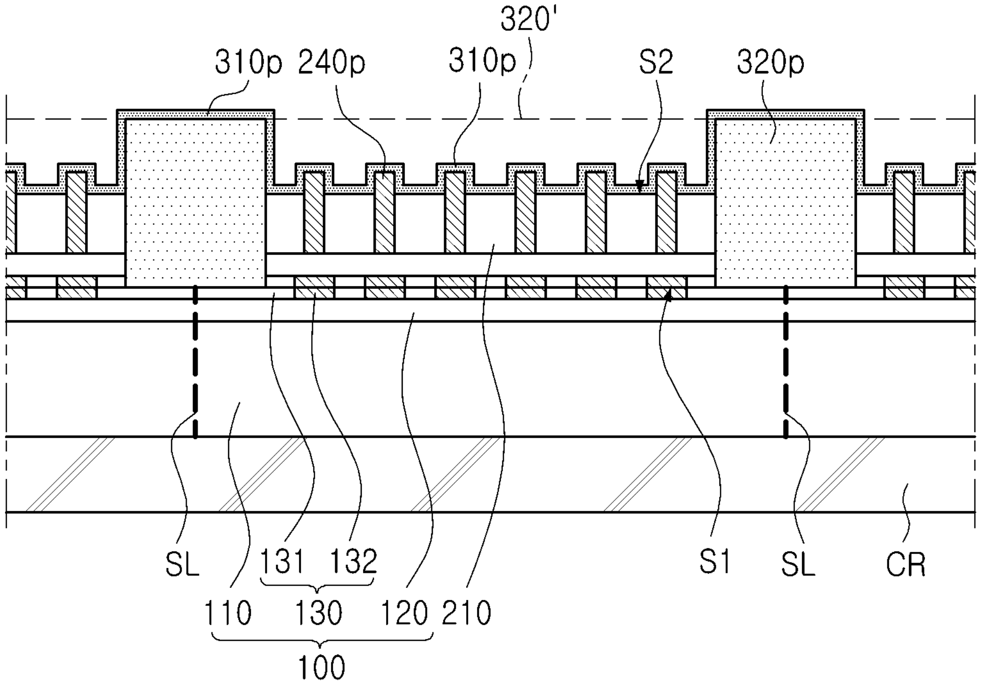

Referring to FIG. 4B, a portion of the organic-inorganic composite material layer 320' may be removed to expose a rear surface S2 of the preliminary semiconductor chip 200*p*, and a second preliminary dielectric layer 320*p* may be formed. The portion of the organic-inorganic composite material layer 320' may be removed by an exposure process and a development process. As a result thereof, the second preliminary dielectric layer 320*p* may include at least one of a silane-based compound and a siloxane-based compound having cross-linked photosensitive functional groups.

Thereafter, a first preliminary dielectric layer 310*p* that covers the second preliminary dielectric layer 320*p*, the rear surface S2 of the preliminary semiconductor chip 200*p*, and at least a portion of each of the plurality of preliminary through-electrodes 240*p*, exposed from the second preliminary substrate 210*p*, may be formed. The first preliminary dielectric layer 310*p* may include at least one of silicon oxide (SiO) and silicon nitride (SiN). The first preliminary dielectric layer 310*p* may be formed using a PVD or CVD process.

Figure 4C:
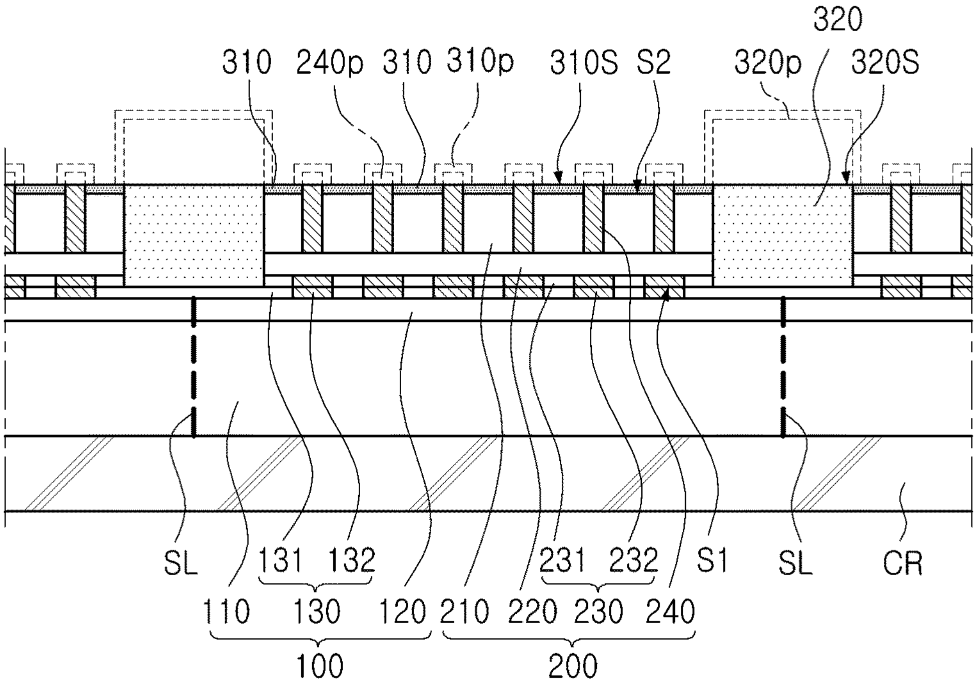

Referring to FIG. 4C, by applying a polishing process to the first preliminary dielectric layer 310*p*, the second preliminary dielectric layer 320*p*, and the plurality of preliminary through electrodes 240*p*, a planar surface comprised of the first dielectric layer 310, the second dielectric layer 320, and the plurality of through electrodes 240 may be formed. The polishing process may include a CMP process. A first dielectric layer 310 that defines a first planar surface 310S and a second semiconductor chip 200 (or a second dielectric layer 320) that defines a second planar surface 320S may be formed by the polishing process. The first planar surface 310S and the second planar surface 320S may be substantially coplanar. At the time at which the polishing process is applied, since a portion of the organic-inorganic composite material layer 320' covering the rear surface S2 of the second semiconductor chip 200 has already been removed, a polishing process time may be shortened and a process difficulty may be lowered.

Figure 4D:
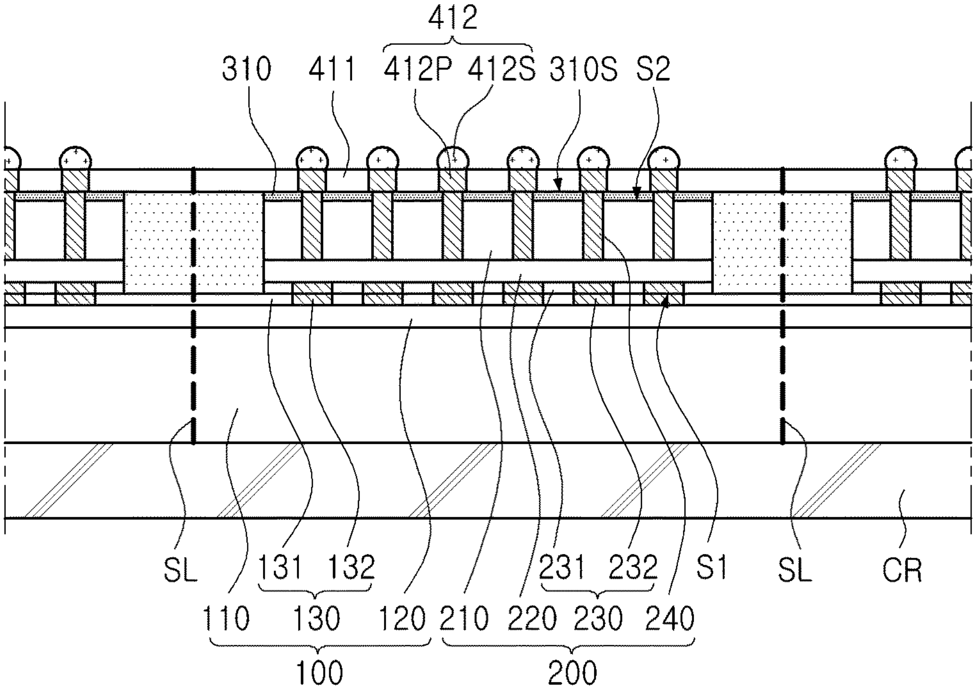

Referring to FIG. 4D, a protective layer 411 and bump structures 412 may be sequentially formed on a planar surface formed through a polishing process. The protective layer 411 may be formed using, for example, a photosensitive resin such as PID or PSR. The bump structures 412 may include a pillar portion 412P and a solder portion 412S. Thereafter, a cutting process may be performed along the scribe line SL to separate the semiconductor packages, respectively.

Figure 5:
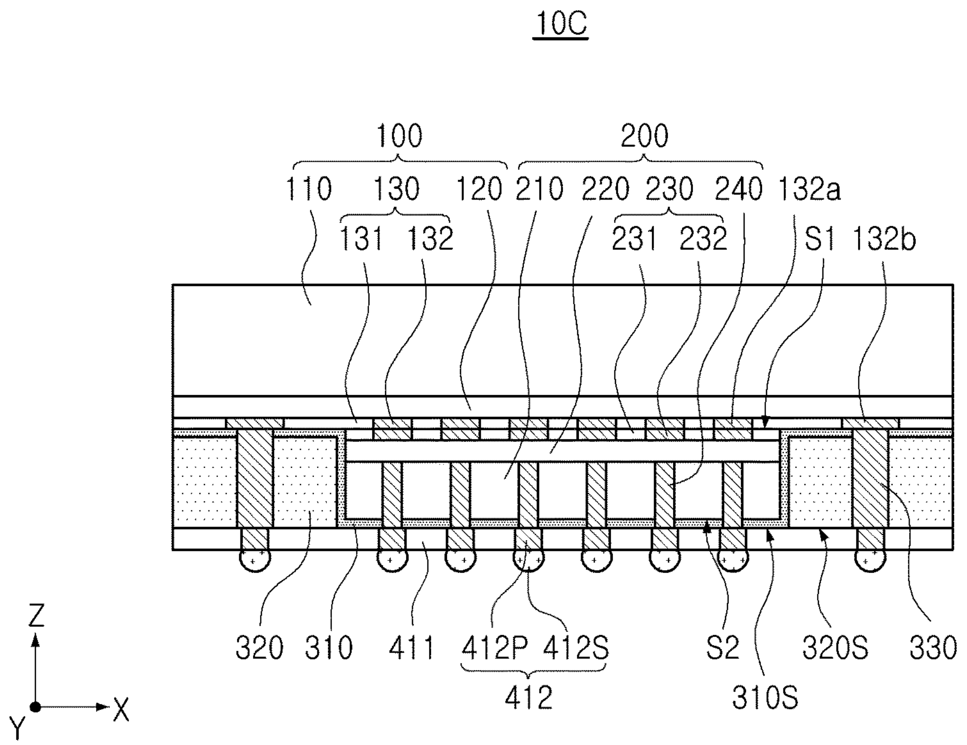
FIG. 5 is a cross-sectional view illustrating a semiconductor package according to some embodiments.

FIG. 5 is a cross-sectional view illustrating a semiconductor package 10C according to some embodiments.

Referring to FIG. 5, a semiconductor package 10C according to some embodiments may have the same as or similar characteristics as those described with reference to FIGS. 1A to 4D except for further including through-via structures 330 penetrating through the second dielectric layer 320.

The through-via structures 330 may be arranged around the second semiconductor chip 200, and electrically connected to the first semiconductor chip 100. For example, the second pads 232 of the second semiconductor chip 200 may be connected to first inner pads 132*a* of the first semiconductor chip 100, and the through-via structures 330 may be connected to first outer pads 132*b* of the first semiconductor chip 100. The first inner pads 132*a* may include signal pads, and the first outer pads 132*b* may include power and/or ground pads, but the present disclosure is not limited thereto. According to some embodiments, the through-via structures 330 may have a width greater than that of through-electrodes 240, but the example embodiment is not limited thereto.

Lower surfaces of the through-via structures 330 may be coplanar with a first planar surface 310S and a second planar surface 320S. The through-via structures 330 may be electrically connected to at least a portion of the bump structures 412 positioned in a portion not vertically overlapping the second semiconductor chip 200. The through-via structures 330 may include any one of copper (Cu), nickel (Ni), titanium (Ti), aluminum (Al), gold (Au), and silver (Ag), or alloys thereof.

Figure 6:
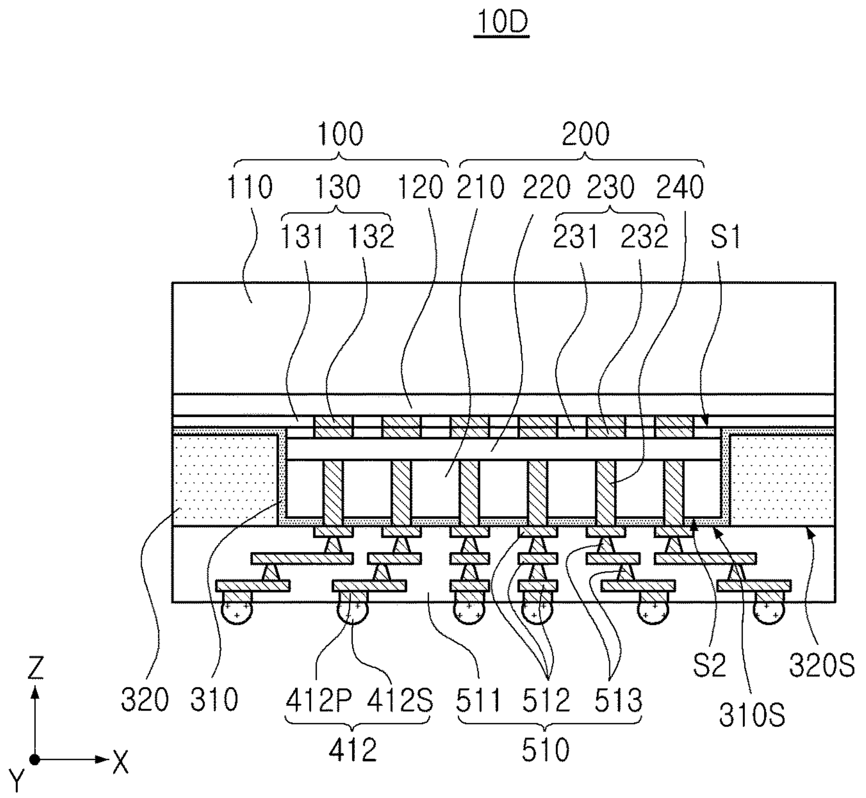
FIG. 6 is a cross-sectional view illustrating a semiconductor package according to some embodiments.

FIG. 6 is a cross-sectional view illustrating a semiconductor package 10D according to some embodiments.

Referring to FIG. 6, a semiconductor package 10D according to some embodiments may have the same as or similar characteristics as those described with reference to FIGS. 1A to 5 except for further including a redistribution structure 510 redistributing the through-electrodes 240. The redistribution structure 510 may be below a first planar surface 310S and a second planar surface 320S, and may include an insulating material layer 511, a redistribution pattern layer 512, and a redistribution via 513.

In some embodiments, the redistribution pattern layer 512 may be directly on the first planar surface 310S. For example, the redistribution pattern layer 512 may include an upper pattern layer directly contacting the first dielectric layer 310 and buried in the insulating material layer 511, and a lower pattern layer below the insulating material layer 511. In this case, the redistribution via 513 may extend vertically within the insulating material layer 511 to connect the lower pattern layer and the upper pattern layer. As described above, by introducing the redistribution structure 510, a layout of the bump structures 412 may be designed in various ways.

The insulating material layer 511 may be formed using a dielectric material such as silicon oxide, silicon nitride, or silicon oxynitride, or a photosensitive resin such as photo-imageable dielectric (PID). The insulating material layer 511 may be formed of a plurality of layers according to the number of layers of the redistribution pattern layer 512. Depending on the process, a boundary between at least a portion of the plurality of insulating material layers 511 may not be clear. According to some embodiments, the pillar portion 412P of the bump structure 412 may be exposed from the insulating material layer 511, and a protective layer ('411' in FIG. 1A) for protecting the bump structure 412 may be formed below the redistribution structure 510.

The redistribution pattern layer 512 may electrically connect the bump structures 412 and the through-electrodes 240. The redistribution pattern layer 512 may include, for example, copper (Cu), aluminum (Al), silver (Ag), tin (Sn), gold (Au), nickel (Ni), lead (Pb), titanium (Ti), or a metal material including an alloy thereof. The redistribution pattern layer 512 may include, for example, a ground pattern, a power pattern, and a signal pattern. The signal pattern may transmit a data signal transmitted from the first semiconductor chip 100 and the second semiconductor chip 200 to the outside or transmit a data signal transmitted from the outside to the first semiconductor chip 100 and the second semiconductor chip 200. The redistribution pattern layer 512 may be formed with more or fewer layers than shown in the figure (two layers).

The redistribution via 513 may extend vertically within the insulating material layer 511 and be connected to the redistribution pattern layer 512. The redistribution via 513 may have a form of a filled via in which a metal material is filled in the via hole or a conformal via in which a metal material is formed along an inner wall of the via hole. The redistribution via 513 may be integrated with the redistribution pattern layer 512, but the present disclosure is not limited thereto. The redistribution via 513 may correspond to the redistribution pattern layer 512, and may be formed in a greater number of layers than shown in the drawings.

Figure 7:
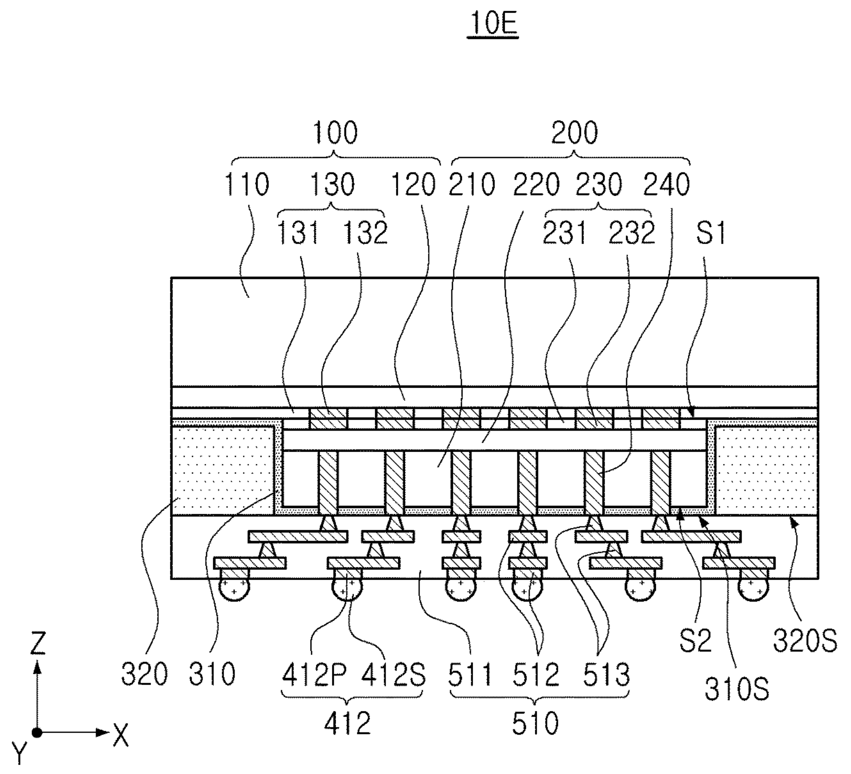
FIG. 7 is a cross-sectional view illustrating a semiconductor package according to some embodiments.

FIG. 7 is a cross-sectional view illustrating a semiconductor package 10E according to some embodiments.

Referring to FIG. 7, a semiconductor package 10E according to some embodiments may have the same as or similar characteristics as those described with reference to FIG. 6 except that an uppermost redistribution pattern layer 512 may be spaced apart from the first dielectric layer 310. The redistribution structure 510 according to some embodiments may include an insulating material layer 511 directly on the first planar surface 310S and the second planar surface 320S, a redistribution pattern layer 512 below the insulating material layer 511, and a redistribution via 513 connected to the redistribution pattern layer 512 and the through-electrodes 240 within the insulating material layer 511. As described above, by separating the first dielectric layer 310 and the uppermost redistribution layer 512, adhesion of the redistribution pattern layer 512 may be secured, and the redistribution pattern layer 512 may be implemented with a relatively fine pitch.

Figure 8:
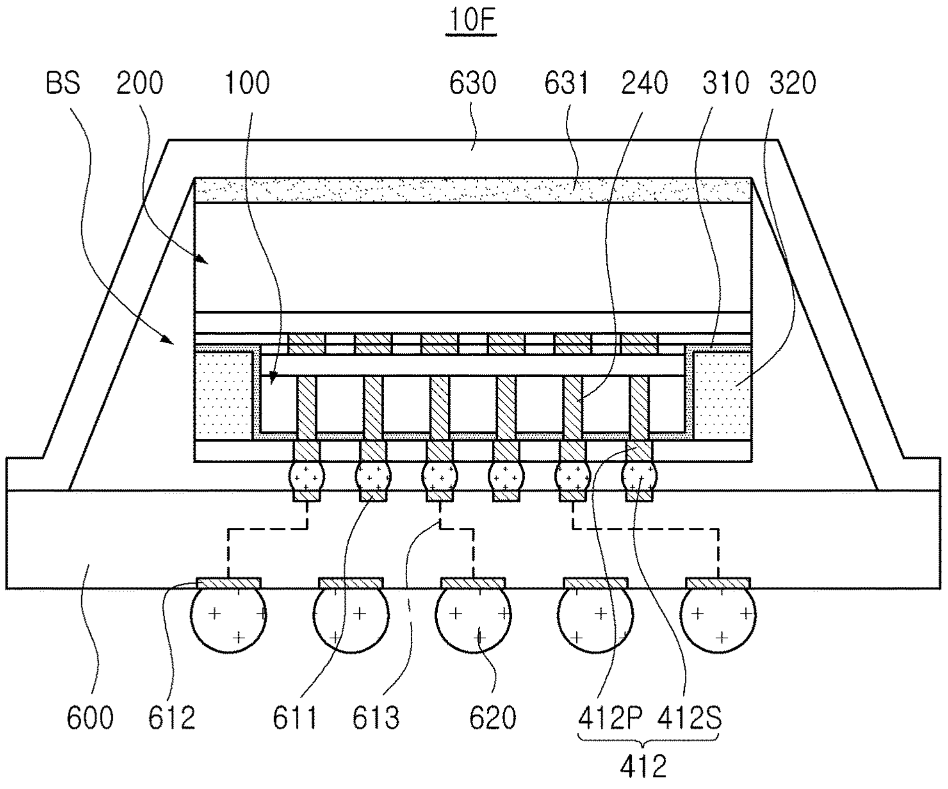
FIG. 8 is a cross-sectional view illustrating a semiconductor package according to some embodiments.

FIG. 8 is a cross-sectional view illustrating a semiconductor package 10F according to some embodiments.

Referring to FIG. 8, a semiconductor package 10F according to some embodiments may include a bonding structure BS, an interconnection substrate 600, and a heat dissipation structure 630. The bonding structure BS may include a first semiconductor chip 100, a second semiconductor chip 200, a first dielectric layer 310, a second dielectric layer 320, and the like, and may have the same as or similar characteristics as those described with reference to FIGS. 1A to 7.

The interconnection substrate 600 may be a support substrate on which the bonding structure BS is mounted, and may be a semiconductor package substrate such as a printed circuit board (PCB), a ceramic board, a tape interconnection substrate, or the like. The interconnection substrate 600 may include a lower pad 612, an upper pad 611, and an interconnection circuit 613 electrically connecting the lower pad 612 and the upper pad 611. A body of the interconnection substrate 600 may include different materials depending on the type of substrate. For example, when the interconnection substrate 600 is a printed circuit board, the interconnection substrate may be formed by additionally stacking interconnection layers on one or both surfaces of a body copper-clad laminate or a copper-clad laminate. The upper pad 611, the lower pad 612, and the redistribution circuit 613 may form an electrical path connecting a lower surface and an upper surface of the interconnection substrate 600. An external connection bump 620 connected to the lower pad 612 may be on the lower surface of the interconnection substrate 600. The external connection bump 620 may include tin (Sn), indium (In), bismuth (Bi), antimony (Sb), copper (Cu), silver (Ag), zinc (Zn), lead (Pb), and/or alloys thereof.

The heat dissipation structure 630 may cover an upper portion of the bonding structure BS. The heat dissipation structure 630 may be attached on the interconnection substrate 600 by an adhesive (not shown). As the adhesive, a thermally conductive adhesive tape, thermally conductive grease, thermally conductive adhesive, or the like may be used. The heat dissipation structure 630 may be attached to an upper portion of the bonding structure BS through a heat transfer material layer 631. The thermal transfer material layer 631 may include, for example, thermally conductive adhesive tape, thermally conductive grease, thermally conductive adhesive, or the like.

The heat dissipation structure 630 may include a conductive material having excellent thermal conductivity. For example, the heat dissipation structure 630 may include a metal or metal alloy including gold (Au), silver (Ag), copper (Cu), iron (Fe), or the like, or a conductive material such as graphite, graphene, and the like. The heat dissipation structure 630 may have a shape different from that shown in the drawings. For example, the heat dissipation structure 630 may have a shape covering only an upper surface of the bonding structure BS.

As set forth above, according to example embodiments, by introducing a dielectric layer including an organic-inorganic composite material, a semiconductor package having a simplified process and improved yield and a method of manufacturing the same may be provided.

The various and advantageous advantages and effects of the inventive concepts disclosed herein are not limited to the above description, and may be more easily understood in the course of describing some examples of specific embodiments of the inventive concepts provided herein. While some examples of embodiments have been shown and described above, it will be apparent to those skilled in the art that modifications and variations could be made without departing from the scope of the present disclosure, as defined by the appended claims.

What is claimed is:

1. A semiconductor package, comprising:

a first semiconductor chip including first pads;

a second semiconductor chip including second pads in contact with the first pads and provided on a first surface of the second semiconductor chip that faces the first semiconductor chip, the second semiconductor chip including through-electrodes electrically connected to the second pads and extending to a second surface of the second semiconductor chip that is opposite from the first surface;

a first dielectric layer that covers the second surface of the second semiconductor chip and a portion of each of side surfaces of the through-electrodes;

a second dielectric layer surrounding a side surface of the second semiconductor chip; and bump structures on a planar surface that is defined by the first dielectric layer and by the second dielectric layer, the bump structures electrically connected to the through-electrodes, wherein the first dielectric layer includes an inorganic compound, and wherein the second dielectric layer includes an organic-inorganic composite material having a coefficient of thermal expansion (CTE) lower than that of the inorganic compound.

2. The semiconductor package of claim 1, wherein the organic-inorganic composite material comprises at least one of a silane-based compound and a siloxane-based compound having cross-linked photosensitive functional groups.

3. The semiconductor package of claim 2, wherein the cross-linked photosensitive functional groups comprise an epoxy group, an acrylate group, or a methacrylate group.

4. The semiconductor package of claim 2, wherein the siloxane-based compound comprises polysilsesquioxane.

5. The semiconductor package of claim 1, wherein the inorganic compound comprises at least one of silicon oxide (SiO) and silicon nitride (SiN).

6. The semiconductor package of claim 1, wherein the CTE of the organic-inorganic composite material is 60 ppm/° C. or lower.

7. The semiconductor package of claim 1, wherein the first dielectric layer extends to a side surface of the second semiconductor chip and a lower surface of the first semiconductor chip.

8. The semiconductor package of claim 7, wherein the second dielectric layer is spaced apart from the side surface of the second semiconductor chip and the lower surface of the first semiconductor chip.

9. The semiconductor package of claim 1, wherein the first semiconductor chip further comprises a first insulating layer that surrounds the first pads, and wherein the second semiconductor chip further comprises a second insulating layer that surrounds the second pads and contacts the first insulating layer.

10. The semiconductor package of claim 9, wherein each of the first insulating layer and the second insulating layer comprises at least one of silicon oxide (SiO), silicon nitride (SiN), and silicon carbonitride (SiCN).

11. The semiconductor package of claim 1, wherein a width of the first semiconductor chip in a first horizontal direction is greater than a width of the second semiconductor chip in the first horizontal direction.

12. The semiconductor package of claim 1, further comprising:

redistribution pattern layers that electrically connect the bump structures and the through-electrodes, and an insulating material layer that covers the redistribution pattern layers.

13. The semiconductor package of claim 12, wherein the insulating material layer comprises a photosensitive resin.

14. The semiconductor package of claim 1, wherein at least one of the bump structures is free from overlap with or by the second semiconductor chip.

15. The semiconductor package of claim 14, further comprising:

through-via structures that extend through the second dielectric layer, and that electrically connect the at least one of the bump structures and at least one of the first pads to each other.

* * * * *